US005773369A

United States Patent [19]

Hu et al.

[11] Patent Number: 5,773,369
[45] Date of Patent: Jun. 30, 1998

[54] PHOTOELECTROCHEMICAL WET ETCHING OF GROUP III NITRIDES

[75] Inventors: Evelyn Lynn Hu; Milan Singh Minsky, both of Goleta, Calif.

[73] Assignee: The Regents of the University of California, Oakland, Calif.

[21] Appl. No.: 641,234

[22] Filed: Apr. 30, 1996

[51] Int. Cl.$^6$ .................................................. H01L 21/302
[52] U.S. Cl. .......................... 438/746; 205/655; 205/666
[58] Field of Search .............................. 156/643.1, 644.1, 156/656.1; 216/94; 205/655, 656, 666, 667, 674; 438/746

[56] References Cited

U.S. PATENT DOCUMENTS

| | | | |
|---|---|---|---|
| 4,559,115 | 12/1985 | Inoue ...................................... | 205/655 |
| 4,576,691 | 3/1986 | Kohl et al. .............................. | 205/655 |
| 4,613,417 | 9/1986 | Laskowski et al. ..................... | 205/655 |
| 4,874,484 | 10/1989 | Foell et al. .............................. | 205/655 |
| 5,454,915 | 10/1995 | Shor et al. .............................. | 205/655 |

FOREIGN PATENT DOCUMENTS

4126916 A1   2/1993   Germany .

OTHER PUBLICATIONS

Y. Pauleau, A. Bouteville, J.J. Hantzpergue, and J.C.Remey, and A. Cachard, "Composition, Kinetics, and Mechanism of Growth of Chemical Vapor–Depositied Aluminum Nitride Films," *J. Electrochem. Soc.*, vol. 129, No. 5, May 1982, 1045–1052.

Mark N. Ruberto, Xiaoge Zhang, Robert Scarmozzino, Alan E. Willner, Dragan V. Podlesnik, and Richard M. Osgood, Jr., "The Laser–Controlled Micrometer–Scale Photoelectrochemical Etching of III–V Semiconductors," *J. Electrochem. Soc.*, vol. 138, No. 4, Apr. 1991, 1174–1185.

A.T. Ping, C. Youtsey, and I. Adesida, "Chemically Assisted Ion Beam Etching of Gallium Nitride," *Journal of Electronic Materials*, vol. 24, No. 4, 1995, 229–234.

Q.X. Guo, O. Kato, and A. Yoshida, "Chemical Etching of Indium Nitride," *J. Electrochem. Soc.*, vol. 139, No. 7, Jul. 1992, 2008–2009.

S.J. Pearton, C.R. Abernathy, F. Ren, J.R. Lothian, P.W. Wisk, and A. Katz, "Dry and Wet Etching Characteristics of InN, AlN, and GaN Deposited by Electron Cyclotron Resonance Metalorganic Molecular Beam Epitaxy," *J. Vac. Sci. Technol. A*, vol. 11, No. 4, Jul./Aug. 1993, 1772–1775.

T.Y. Sheng, Z.Q. Yu, and G.J. Collins, "Disk Hydrogen Plasma Assisted Chemical Vapor Deposition of Aluminum Nitride," *Appl. Phys. Lett.*, vol. 52, No. 7, Feb. 15, 1988, 576–578.

(List continued on next page.)

*Primary Examiner*—R. Bruce Breneman
*Assistant Examiner*—Anita Alanko
*Attorney, Agent, or Firm*—Merchant, Gould, Smith, Edell, Welter & Schmidt

[57] ABSTRACT

A method of processing semiconductor films and layers, especially Group III Nitride films, has been achieved, using laser-enhanced, room-temperature wet etching with dilute etchants. Etch rates of a few hundred Å/min up to a few thousand Å/min have been achieved for unintentionally doped n-type Group III Nitride films grown by MOCVD on a sapphire substrate. The etching is thought to take place photoelectrochemically with holes and electrons generated by incident illumination from 4.5 mW of HeCd laser power enhancing the oxidation and reduction reactions in an electrochemical cell.

11 Claims, 3 Drawing Sheets

OTHER PUBLICATIONS

R.W. Haisty, "Photoetching and Plating of Gallium Arsenide," *J. Electrochem. Soc.*, vol. 108, No. 8, Aug. 1961, 790–794.

F. Kuhn–Kuhnenfeld, "Selective Photoetching of Gallium Arsenide," *J. Electrochem. Soc.*, vol. 119, No. 8, Aug. 1972, 1063–1068.

Reena Khare and Evelyn L. Hu, "Dopant Selective Photoelectrochemical Etching of GaAs Homostructures," *J. Electrochem. Soc.*, vol. 138, No. 5, May 1991, 1516–1519.

Reena Khare, Evelyn L. Hu, Julia J. Brown, and Melissa A. Melendes, "Micromachining in III–V semiconductors using wet photoelectrochemical etching," *J. Vac. Sci. Technol. B*, vol. 11, No. 6, Nov./Dec. 1993, 2497–2501.

R. Khare, D.B. Young, and E.L. Hu, "The Bandgap–Selective Photochemical Etching of GaAs/Al$_x$Ga$_{1-x}$As Heterostructures with Varying Mole Fraction," *J. Electroelectrochem. Soc.*, vol. 140, No. 7, Jul. 1993, L117–L118.

S.J. Pearton, C.B. Vartuli, R.J. Shul, and J.C. Zolper, "Dry Etching and Implantation Characteristics of III–N Alloys," *Materials Science and Engineering*, vol. B31, 1995, 309–317.

J.R. Mileham, S.J. Pearton, C.R. Abernathy and J.D. MacKenzie, "Wet Chemical Etching of AlN," *Appl. Hys. Lett.*, vol. 67, No. 8, Aug. 21, 1995, 119–120 & 1121.

M. Lax, "Temperature Rise Induced by a Laser Beam," *J. of Applied Physics*, vol. 48, No. 9, Sep. 1977, 3919–3924.

Morkoc, S. Strite, G.B. Gao, M.E. Lin, B. Sverdlov and M. Burns, "Large–band–gap SiC, III–V Nitride, and II–VI ZnSe–based Semiconductor Device Technologies," *J. Applied Physics*, vol. 76, No. 3, Aug. 1, 1994, 1363–1398.

Pearton, S. J. et al "Dry and wet etching characteristics of InN, AlN and GaN deprosited by ECR metalorganic molecular beam epitaxy" J. Vac. Sci. Technol.A vol. 11 No. 4, pp. 1772–1775, Jul 1993.

Lu, J. et al "Photoassisted Anodic Etching of Gallium Nitride" J. Electrochem. Soc. vol. 144, No. 1, pp. L8–11, Jan. 1997.

Youtsey et al "Broad–area photoelectrochemical etching of GaN" Electron. Lett. vol. 33, No. 3, pp. 245–246, Jan. 1997.

Vartuli, C.B. et al "Wet Chemical Etching of AlN and InAlN in KOH Solutions" J. Electrochem. Soc., vol. 143, No. 11, pp. 3681–3684, Nov. 1996.

Pankove, J.I. "Electrolytic Etching of GaN" J. Electrochem. Soc., vol. 119, No. 8, pp. 1118–1119, Aug. 1972.

PHOTOELECTROCHEMICAL WET ETCHING OF GROUP III NITRIDES

STATEMENT AS TO RIGHTS TO INVENTIONS MADE UNDER FEDERALLY SPONSORED RESEARCH AND DEVELOPMENT

This invention was made with Government support under Grant No. DMR-9120007, awarded by the National Science Foundation. The Government has certain rights in this invention.

BACKGROUND OF THE INVENTION

1. Field of the Invention

This invention relates in general to a method of processing a semiconductor wafer, and, more particularly, to a photoelectrochemical etching process to etch Group III Nitrides.

2. Description of Related Art

The use of various semiconductor materials has necessitated the use of different fabrication processes to achieve proper growth of material, adequate conductive regions within the materials, and precise etching to produce working devices. As new material layers are grown to higher and higher qualities, new processes to configure the layers to working devices are required.

In semiconductor processing, it is often necessary to form deeply etched holes or wells either individually or in large arrays. The requirements for these geometries include deep profiles with precisely controlled sidewalls and features, such as etch "mesas" and "troughs" ranging in size from a few tens of microns to a few hundreds of microns. One technique to perform these types of etches is photoelectrochemical (PEC) etching, where a laser is used to enhance normal wet chemical etching.

For materials that are found to be chemically inert, such as the Group III Nitrides (Gallium Nitride (GaN) , etc.), prior art wet etch techniques, including PEC, have been ineffective. The etch rates have been too slow for efficient processing. Further, the wet etch techniques have generally not been directional enough to produce sidewalls that mirror the masking material.

Recently, there has been impressive progress in the growth of high quality of GaN epitaxial layers and in their utilization for high performance optical devices. The Group III Nitrides clearly hold great promise as the basis for a variety of high performance optoelectronic and electronic devices. A viable device technology will require the availability of effective processes for etching the component materials.

The Group III Nitrides are distinguished by their unusual chemical stability, making it difficult to identify reliable and controllable wet etchants. To date, room-temperature wet etching of the Group III Nitride films has produced slow etch rates, of the order of tens and hundreds of angstroms per minute. Elevating the temperature of the etchant can increase the etch rates to $\approx 500$ Å/min etch rates of AlN in $H_3PO_4$ heated to 65°–85° C., and InN films may be etched in aqueous KOH and NaOH solutions at 60° C. to produce etch rates of $\approx 300$–600 Å/min. The use of elevated temperatures is generally less desirable, because the elevated temperature of the etchant has adverse effects on photoresist and other masking materials. Further, the elevated temperature of the etchant creates safety hazards for personnel that are processing the devices.

Reactive ion etching has proven to be effective for GaN, achieving etch rates of 200–3000 Å/min in a number of different gas chemistries. Reactive ion etching is quite expensive, thus increasing the costs of the finished devices. The ion bombardment inherent in reactive ion etching also provides greater possibility of damage to the device than wet chemical etching.

It can be seen then that there is a need for a method of wet etching Group III Nitride films that is faster than those currently available. It can also be seen that there is a need for a method of wet etching Group III Nitride films that presents fewer hazardous conditions to personnel. It can also be seen that there is a need for a method of processing Group III Nitride films that is repeatable and predictable. It can also be seen that there is a need for a method that reduces the cost of the finished device that contains a Group III Nitride film. It can also be seen that there is a need to provide a low-damage method of processing Group III Nitride films.

SUMMARY OF THE INVENTION

To overcome the limitations in the prior art described above, and to overcome other limitations that will become apparent upon reading and understanding the present specification, the present invention discloses a powerful and highly productive method for etching Group III Nitrides. The present invention is comprehensive and can be fully integrated with present fabrication methods.

The present invention solves the above-described problems by providing a method for etching Group III Nitrides that operates at room temperature and is relatively inexpensive. Further, the method provides etch well sidewalls that mirror the mask geometries, avoiding undercutting and etch well sidewall deformities.

One object of the present invention is to provide a precise method for etching Group III Nitrides. Another object of the present invention is to provide a method for etching Group III Nitrides at room temperature.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized and structural and functional changes may be made without departing from the scope of the present invention.

The present invention provides a method for wet chemical etching of Group III Nitrides. This method can be utilized for other materials that have similar properties as Group III Nitrides, such as semi-insulating (SI) Gallium Arsenide (GaAs) and Indium Phosphide (InP). For photoelectrochemical etching methods, the property of undoped GaAs and undoped InP that is most difficult to overcome is the relative lack of reactivity of these materials.

The use of photoelectrochemical (PEC) etching is evident in the prior art. The PEC process was thought to be ineffective on p-type and semi-insulating materials because in those materials, there are not enough holes at the surface to allow the wet chemistry to progress and etch the material. This process was explained by "band-bending," referring to the Fermi levels or "bands" which would describe the material properties.

The present invention shows that band-bending alone does not determine the rate of PEC etching. The present invention shows that the inefficient extraction of electrons can impede etching when electrons recombine with the photogenerated holes faster than the wet chemistry could remove the material.

Figure 1A:
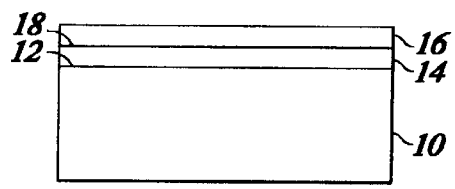
FIGS. 1A–1E are cross-sectional views of the preparation methods used for the etching method of the invention.

FIGS. 1A–1E are cross-sectional views of the preparation steps used for the etching method of the invention. FIG. 1A shows a substrate 10. The substrate 10 can be of any material, but is preferably sapphire. On top surface 12 of substrate 10, a Group III Nitride layer 14 is grown. The Group III Nitride layer 14 can be a single layer of material, such as a Group III Nitride, but can also be a heterostructure, which has multiple layers of materials of similar or different compositions. The Group III Nitride layer 14 can be of various thicknesses, but is typically several thousand angstroms thick. The Group III Nitride layer 14 is grown using metal organic chemical vapor deposition (MOCVD), but other methods of growing the Group III Nitride layer 14 may also be used. A masking layer 16 is then formed on top of the etch surface 18 of the Group III Nitride layer 14 to overlay the Group III Nitride layer 14. The masking layer 16 forms a pattern which, after etching, will transfer to the Group III Nitride layer 14. The masking layer 16 also serves as an electrical contact to the Group III Nitride layer 14 to allow electrons to flow from the Group III Nitride layer 14 to the masking layer 16. The masking layer 16 can be of any material that will make an ohmic contact with the Group III Nitride layer 14, but is preferably titanium, gold, or silver. The masking layer 16 is preferably formed using an electron beam evaporation, but may also be formed using other methods. To ensure a good ohmic contact between the masking layer 16 and the Group III Nitride layer 14, the masking layer 16 can be annealed or exposed to other processes.

Figure 1B:
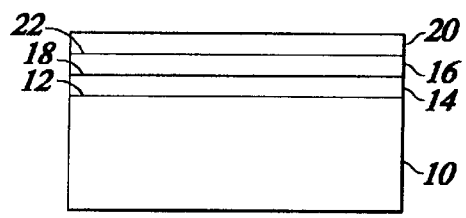

FIG. 1B shows the structure of FIG. 1A with a photoresist layer 20 deposited on the top mask surface 22. The photoresist layer 20 is typically deposited by spinning, but can be deposited by other methods as well.

Figure 1C:
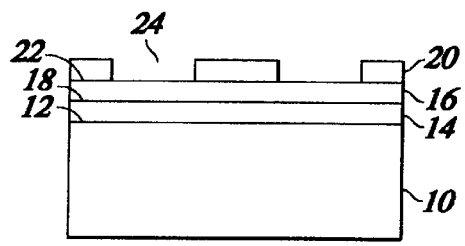

FIG. 1C shows the structure of FIG. 1B after the photoresist layer 20 has been covered with a pattern mask and then exposed to ultraviolet light. The exposed areas of the photoresist layer 20 will alternatively either be hardened or removed from the top mask surface 22. The openings 24 selectively expose the top mask surface 22 for wet chemical or reactive ion etching processes.

Figure 1D:
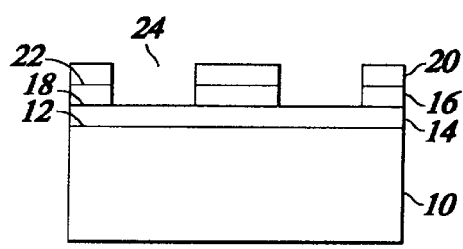

FIG. 1D shows the structure of FIG. 1C after a wet chemical or reactive ion etch has taken place. The openings 24 allow the wet chemical etch or reactive ion etch to selectively etch through the masking layer 16 to the Group III Nitride layer 14.

Figure 1E:
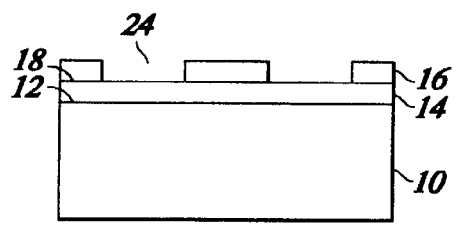

FIG. 1E shows the photoresist layer 20 removed from the structure of FIG. 1D. The openings 24 remain, selectively exposing the etch surface 18 of the Group III Nitride layer 14.

Figure 2:
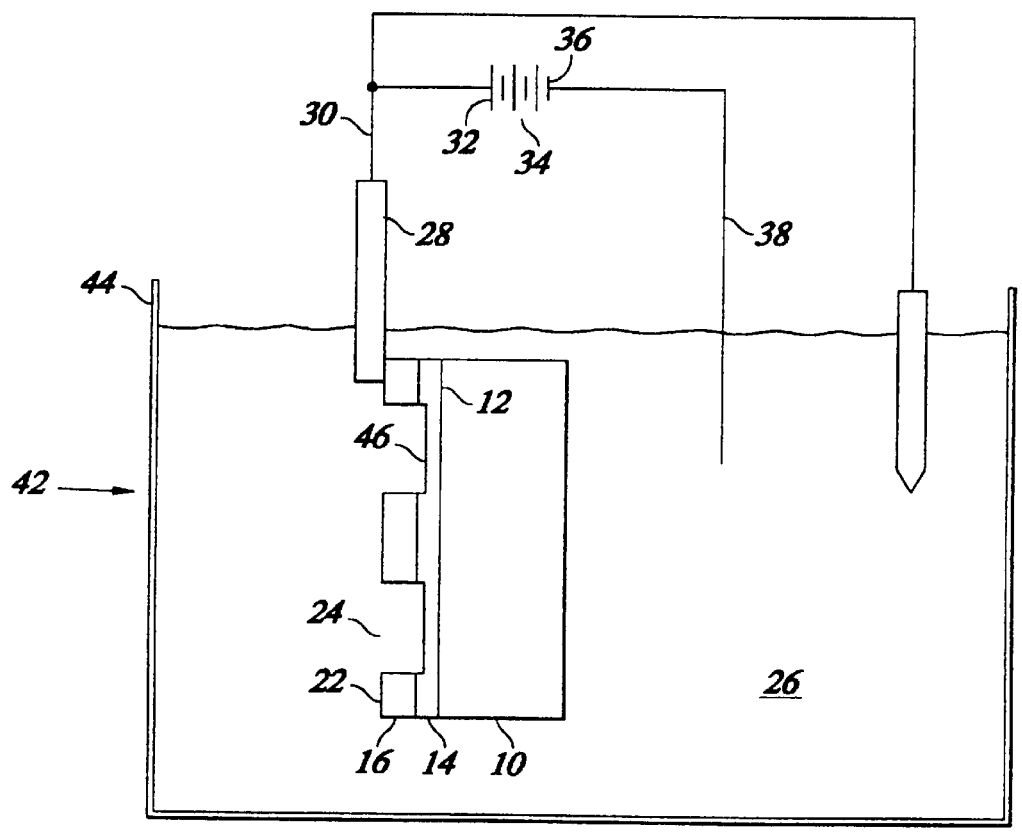
FIG. 2 is a cross-sectional view of the etching method of the invention.

FIG. 2 shows a cross-sectional view of the etching method of the invention. The structure of FIG. 1E is immersed in an etchant solution 26. The etchant solution 26 can be any etchant, but is preferably a 1:10 HCl:$H_2O$ solution for etch rates in the hundreds of angstroms per minute, or a 1:3 KOH:$H_2O$ solution for etch rates in the thousands of angstroms per minute.

A plate 28 is coupled to the top mask surface 22. The plate 28 is electrically conductive, and is typically a glass plate that has been coated with a conductive coating, but can be a metal plate or other composition plate. The conductive coating is typically chromium or gold, but can be any other conductive coating.

The plate 28 is connected by a wire 30 to the positive plate 32 of a battery 34. The negative plate 36 of the battery 34 is connected to an electrode 38. The electrode 38 is typically a platinum wire, but can be any other conductive material. The electrode 38 is immersed in the etchant solution 26.

The positive plate 32 of the battery 34 is also connected to a second electrode 40. The connections between the plate 28, electrode 38 and second electrode 40 allow a bias to be applied to the masking layer 16, the amount of the bias being the voltage produced by the battery 34.

Laser energy 42 is then shined through the container 44 onto the top mask surface 22 of the substrate 10. The laser energy 42 must be above the bandgap energy of the Group III nitride layer 14, or the Group III nitride layer will not be etched. The laser energy 42 assists the etchant solution 26 in etching a well 46 in the Group III Nitride layer 14 exposed to the openings 24 by providing energy to the openings 24 illuminated by the laser energy 42. Examples of etching rates achieved using the method of the invention are described below. For comparison, etching rates achieved using other techniques are also described.

1. Etching rates using: Masking layer 16, no laser energy 42, and etchant solution 26 of 1:10 HCl:$H_2O$ Without using the laser energy 42, a substrate 10 with a Group III Nitride layer 14 and a masking layer 16 was immersed in a 1:10 HCl:$H_2O$ etchant solution 26. After 37.5 hours, no significant etching was observed in the Group III Nitride layer 14.

2. Etching rates using: laser energy 42, etchant solution 26 of 1:10 HCl:$H_2O$, but no masking layer 16

Without a masking layer 16, and again using a 1:10 HCl:$H_2O$ etchant solution 26, adding laser energy 42 with an energy output of 4.5 milliwatts, which delivers a power density of 0.57 Watts/$cm^2$ and 1 millimeter diameter produced a well 46 about 900 angstroms deep in the Group III Nitride layer 14. This corresponds to an etch rate of 15 angstroms per minute.

3. Etching rates using: masking layer 16, laser energy 42, and etchant solution 26 of 1:10 HCl:$H_2O$ When the masking layer 16 is added to the etch surface 18, and again using a 1:10 HCl:$H_2O$ etchant solution 26, laser energy 42 with an energy density of 0.57 Watts/$cm^2$ and 1 mm diameter produced a well 46 about 8000 angstroms deep in the Group III Nitride layer 14 in approximately 20 minutes. This corresponds to an etch rate of 400 angstroms per minute.

4. Etching rates using: masking layer 16, no laser energy 42, and etchant solution 26 of 1:3 KOH:$H_2O$ Without using the laser energy 42, a substrate 10 with a Group III Nitride layer 14 and a masking layer 16 was immersed in a 1:3 KOH:H$_2$O etchant solution 26. After 45 minutes, no significant etching was observed in the Group III Nitride layer 14.

5. Etching rates using: laser energy 42 below the bandgap energy of the Group III Nitride layer 14, etchant solution 26 of 1:3 KOH:H$_2$O, and masking layer 16

With a masking layer 16, and again using a 1:3 KOH:H$_2$O etchant solution 26, adding laser energy 42 for 15 minutes with an energy level below the bandgap energy of the Group III Nitride layer 14 produced no significant etching of the Group III Nitride layer 14.

6. Etching rates using: laser energy 42 above the bandgap energy of the Group III Nitride layer 14, etchant solution 26 of 1:3 KOH:H$_2$O, and masking layer 16

When the laser energy 42 is above the bandgap energy of the Group III Nitride layer 14, and the masking layer 16 is deposited on the etch surface 18, and again using a 1:10 HCl:H$_2$O etchant solution 26, laser energy 42 with an energy density of 0.57 Watts/cm$^2$ and 1 mm diameter produced a well 46 about 20,000 angstroms deep in the Group III Nitride layer 14 in a five minute period. This corresponds to an etch rate of 4,000 angstroms per minute.

Figure 3:
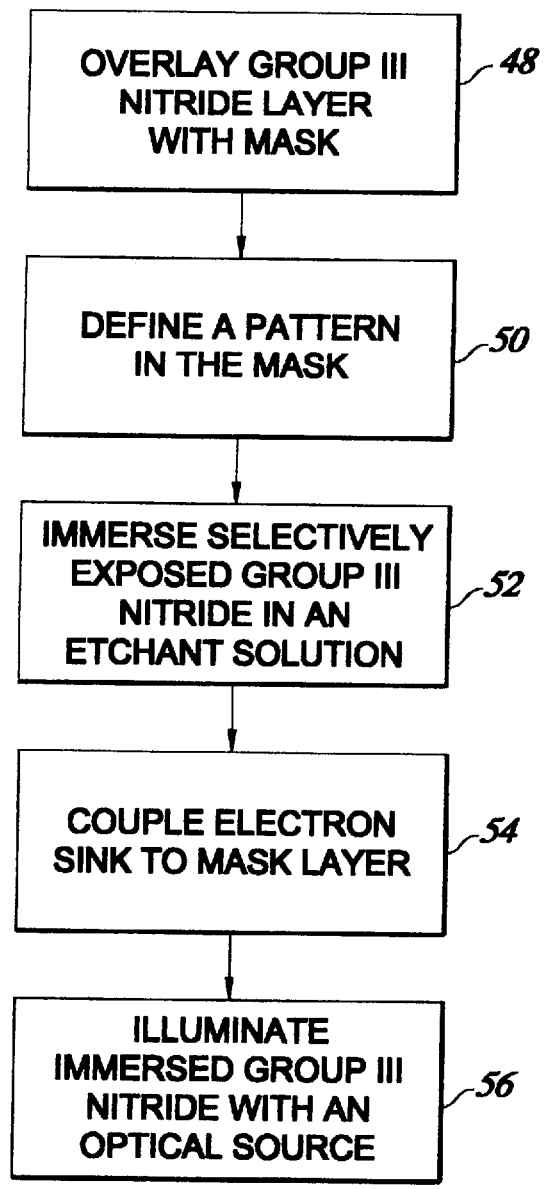
FIG. 3 is a flowchart describing the steps performed in the etching method of the invention.

FIG. 3 is a flowchart describing the steps performed in the etching method of the invention. Step 48 overlays the Group III Nitride layer with a mask. Step 50 defines a pattern in the mask, alternatively exposing and covering the Group III Nitride layer with the mask. Step 52 immerses the selectively exposed Group III Nitride in an etchant solution. Step 54 couples an electron sink to the mask. Step 56 illuminates the selectively exposed Group III Nitride with an optical source, etching the selectively exposed Group III Nitride layer.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of wet etching a Group III Nitride semiconductor layer, comprising the steps of:

overlaying the Group III Nitride semiconductor layer with a mask, wherein the mask defines a pattern to be transferred to the Group III Nitride semiconductor layer and facilitates a flow of photogenerated carriers from an area of the Group III Nitride semiconductor layer to be etched;

immersing the Group III Nitride semiconductor layer in an etchant solution, the etchant solution being unable to etch the Group III Nitride semiconductor layer, the etchant solution further being unheated; and illuminating the immersed Group III Nitride semiconductor layer using an optical source containing frequencies above the bandgap of the Group III Nitride semiconductor layer, wherein the step of illuminating etches the Group III Nitride layer.

2. The method of claim 1, wherein the method further comprises the step of coupling the mask to a conductive path which draws electrons from the mask to a higher electrical potential.

3. The method of claim 1, wherein a sidewall of the area to be etched substantially mirrors the geometry of the mask.

4. The method of claim 1, wherein an etch rate exceeds 100 angstroms per minute.

5. The method of claim 1, wherein the temperature of the etchant solution is less than 40 degrees centigrade.

6. The method of claim 1, wherein the mask comprises at least one of the group comprising:

gold;

silver;

titanium; or composite metals.

7. The method of claim 1, wherein the power of the optical source is 4.5 mW.

8. The method of claim 1, wherein a concentration of the etchant solution is less than the concentration required to etch the Group III Nitride semiconductor layer without the optical source.

9. The method of claim 1, wherein the type of etchant solution is selected from the group comprising:

Potassium Hydroxide; and

Hydrochloric Acid.

10. The method of claim 1, wherein the Group III Nitride semiconductor layer comprises a heterostructure.

11. A method of etching a Group III Nitride layer, comprising the steps of:

overlaying the Group III Nitride layer with a mask, wherein the mask ensures an unimpeded flow of photogenerated carriers from an area of the layer to be etched;

immersing the Group III Nitride layer in an etchant solution, the etchant solution being unable to etch the Group III Nitride layer, the etchant solution further being unheated;

coupling the mask to a conductive path which draws electrons from the mask to a higher electrical potential; and illuminating the immersed Group III Nitride layer using an optical source containing frequencies above the bandgap of the Group III Nitride layer, wherein the step of illuminating etches the Group III Nitride layer.

* * * * *